United States Patent
Weiss et al.

(10) Patent No.: US 9,835,697 B2
(45) Date of Patent: Dec. 5, 2017

(54) RF-SAFE INTERVENTIONAL OR NON-INTERVENTIONAL INSTRUMENT FOR USE IN AN MRI APPARATUS

(71) Applicant: KONINKLIJKE PHILIPS N.V., Eindhoven (NL)

(72) Inventors: Steffen Weiss, Hamburg (DE); Oliver Lips, Hamburg (DE); Bernd David, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 680 days.

(21) Appl. No.: 14/359,151

(22) PCT Filed: Nov. 22, 2012

(86) PCT No.: PCT/IB2012/056621
§ 371 (c)(1),
(2) Date: May 19, 2014

(87) PCT Pub. No.: WO2013/076677
PCT Pub. Date: May 30, 2013

(65) Prior Publication Data
US 2014/0303485 A1    Oct. 9, 2014

Related U.S. Application Data

(60) Provisional application No. 61/562,477, filed on Nov. 22, 2011.

(30) Foreign Application Priority Data

Nov. 22, 2011 (EP) .................................. 11190077

(51) Int. Cl.
*G01R 33/28* (2006.01)

(52) U.S. Cl.
CPC .................................. *G01R 33/288* (2013.01)

(58) Field of Classification Search
CPC .................................................... G01R 33/288
See application file for complete search history.

(56) References Cited

U.S. PATENT DOCUMENTS

| | | | |
|---|---|---|---|
| 4,951,672 A | 8/1990 | Buchwald | |
| 5,138,287 A * | 8/1992 | Domokos | H01P 5/12 333/12 |

(Continued)

FOREIGN PATENT DOCUMENTS

| | | |
|---|---|---|
| EP | 2067501 A2 | 6/2009 |
| WO | 2009004548 A2 | 1/2009 |
| WO | 2011051094 A1 | 5/2011 |

OTHER PUBLICATIONS

Ladd, Mark E. et al "Reduction of Resonant RF Heating in Intravascular Catheters using Coaxial Chokes", Magnetic Resonance in Medicine, vol. 43, No. 4, 2000, pp. 615-619.

(Continued)

*Primary Examiner* — Bo J Peng

(57) ABSTRACT

An RF-safe interventional or a non-interventional instrument is used during an MR imaging or MR examination of an examination object (A). The instrument is made of or includes at least one longitudinal or elongated electrically conductive element (1, 3), for example, in the form of a conductor or wire or line for feeding electrical signals, or in the form of the instrument itself or a component or a part thereof, which is not provided for feeding electrical signals but is nevertheless electrically conductive. All such elements are subject to RF common mode currents which are induced in the element when the instrument or element is exposed to an RF/MR excitation field generated during MR imaging or MR examination by an MR imaging apparatus. The instrument is made RF-safe by increasing the energy loss of an (Continued)

oscillator which is represented by the conductor (1, 3) by a damping element (4; 6) in order to prevent or limit RF heating of the examination object (A) at or surrounding the conductor (1, 3).

9 Claims, 3 Drawing Sheets

(56) References Cited

U.S. PATENT DOCUMENTS

| | | | |
|---|---|---|---|
| 6,496,714 B1 | 12/2002 | Weiss | |
| 6,993,373 B2 | 1/2006 | Vrijheid et al. | |
| 7,956,704 B1* | 6/2011 | Acimovic | H01P 1/203 |
| | | | 333/181 |
| 8,509,876 B2 | 8/2013 | Kramarkar | |
| 8,643,372 B2 | 2/2014 | Weiss | |
| 2005/0270031 A1* | 12/2005 | Oppelt | G01R 33/3614 |
| | | | 324/322 |
| 2007/0279061 A1* | 12/2007 | Erickson | G01R 33/345 |
| | | | 324/322 |
| 2009/0118610 A1 | 5/2009 | Karmarkar | |
| 2009/0171421 A1 | 7/2009 | Atalar | |
| 2009/0251236 A1* | 10/2009 | Gleich | G01R 33/287 |
| | | | 333/24 R |
| 2010/0013484 A1 | 1/2010 | Wirtz | |
| 2010/0041977 A1 | 2/2010 | Lips | |
| 2010/0134273 A1* | 6/2010 | Weiss | G01R 33/285 |
| | | | 340/532 |
| 2010/0181109 A1 | 7/2010 | Krueger | |
| 2010/0253338 A1 | 10/2010 | Eryaman | |

OTHER PUBLICATIONS

Lips, O. et al "Influence of Electrical Connections on Catheter Heating", Proc. Intl. Society Magnetic Resonance in Medicine, vol. 19, 2011 pp. 3769.

Vernickel, P. et al "Simulations on a Transformer Based Transmission LIne to Achieve Enhanced RF-Safety", Proc. Intl. Society Magnetic Resonance in Medicine, vol. 13, 2005, pp. 882.

Seeber, D.A. et al "Floating Shield Current Suppression Trap", Concepts in Magnetic Resonance, vol. 21B, No. 1, Jan. 2004, pp. 26-31.

Weiss, Steffen et al "In Vivo Evaluation and Proof of Radionfrequency Safety of a Novel Diagnostic MR-Electrophysiology Catheter", Magnetic Resonance in Medicine, vol. 65, No. 3, 2011, pp. 77-777.

Bottomley, Paul A. et al "Designing Passive MRI-Safe Implantable Conducting Leads with Electrodes", Medical Physics, vol. 37, No. 7, 2010.

Weiss et al "Transmission Line for Improved RF Safety of Interventional Devices" Magnetic Resonance in Med. 54: p. 182-189 (2005).

* cited by examiner

RF-SAFE INTERVENTIONAL OR NON-INTERVENTIONAL INSTRUMENT FOR USE IN AN MRI APPARATUS

CROSS-REFERENCE TO PRIOR APPLICATIONS

This application is the U.S. National Phase application under 35 U.S.C. §371 of International Application No. PCT/IB2012/056621, filed on Nov. 22, 2012, which claims the benefit of U.S. Provisional Patent Application No. 61/562,477, filed on Nov. 22, 2011 and European Patent Application No. 11190077.5, filed on Nov. 22, 2011. These applications are hereby incorporated by reference herein.

FIELD OF THE INVENTION

The invention relates to an RF-safe interventional or a non-interventional instrument for use during an MR imaging or MR examination of an examination object, which instrument is made of or comprises at least one longitudinal or elongated electrically conductive element, especially in the form of a conductor or wire or line for feeding electrical signals, or in the form of the instrument itself or a component or a part thereof, which is not provided for feeding electrical signals but nevertheless electrically conductive, wherein all such elements ("conductors") are subject to RF common mode currents which are induced in the element when the instrument or element is exposed to an RF/MR excitation field generated during MR imaging or MR examination by means of an MR imaging apparatus.

Such instruments and components or parts, respectively, are for example catheters, probes, surgical devices, biopsy or puncture needles, pointers, implants, wire-braided introducer sheaths, guide-wires or pacemaker leads, or other invasive or any non-invasive devices, like position markers, or surface coils or local coils like head coils.

Generally, the above longitudinal or elongated electrically conductive elements can be positioned at, or form a distal part or section of the instrument and/or can be positioned at, or form a proximal part or section of the instrument. In the latter case, such an element is for example an RF transmission line or cable for connecting the instrument with related RF transmit units, MR receive units, power supply units or other especially remote signal receiving and/or signal processing units.

BACKGROUND OF THE INVENTION

In an MR imaging apparatus, an examination object, usually a patient, is exposed within the examination space of the MR imaging apparatus to a uniform main magnetic field ($B_0$ field) so that the magnetic moments of the nuclei within the examination object tend to rotate around the axis of the applied $B_0$ field (Larmor precession) with a certain net magnetization of all nuclei parallel to the $B_0$ field. The rate of precession is called Larmor frequency which is dependent on the specific physical characteristics of the involved nuclei and the strength of the applied $B_0$ field.

By transmitting an RF excitation field ($B_1$ field) which is orthogonal to the $B_0$ field, generated by means of an RF transmit antenna or coil, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation field, the MR relaxation processes of the longitudinal and transversal components of the net magnetization begin, until the net magnetization has returned to its equilibrium state. MR relaxation signals which are emitted by the relaxation processes, are detected by means of an RF/MR receive antenna or coil. The received MR signals which are time-based amplitude signals, are Fourier transformed to frequency-based MR spectrum signals and processed for generating an MR image of the nuclei of interest within an examination object.

Interventional and non-interventional instruments or medical devices are frequently used during the MR examination or treatment of an examination object and especially of a local zone or area thereof Such instruments or devices which are exemplarily mentioned above, are used for example for MR guided biopsies, thermal ablations, brachytherapy, vascular interventions, electrophysiology and other invasive or non-invasive applications.

A general problem with such instruments is that they usually comprise or are made of one or more elongate or longitudinal electrically conductive elements as explained above. Due to the fact that the interventional or non-interventional instruments are usually at least partly exposed to an RF/MR excitation field of an MR imaging apparatus when used during MR image generation, RF common mode currents can be induced in these elements by the RF/MR excitation field, so that the related adjacent or surrounding examination object is subject to a potential and undesired RF heating by these currents.

In other words, an elongate or longitudinal electrically conductive element in the sense above shall be any element in which RF common mode currents can be induced by the RF/MR excitation field, wherein these currents result in a potential and undesired RF heating of an adjacent or surrounding tissue of an examination object. In the following, all these elements shall be commonly denoted by the term "conductor".

Generally, the above instruments have to be made RF-safe in the sense that any adjacent or surrounding tissue of an examination object is not RF heated to an undesired extent. The same applies for any RF transmission lines or cable the instruments comprise or by means of which the above instruments are connected with related RF transmitter units, MR receiver units, power supply units or other signal processing or control units.

In order to avoid or minimize such RF heating and to obtain RF-safety, various concepts have been proposed according to which conductors or RF transmission lines are provided for example with RF trap circuits, RF chokes, high impedance segments and/or other electrical circuits which are distributed along the length of the related conductor or RF transmission line in order to segment the same and by this to prevent the generation of RF common mode currents on the conductor by the RF/MR excitation field and to prevent the corresponding RF heating.

US 2009/0171421 discloses such an MRI/RF compatible medical interventional device which comprises a lead system with a first and a second conductor, wherein MR safety shall be obtained by providing the lead system along its length with a plurality of spaced apart circuit segments which have a high impedance at a high range of frequencies and a low impedance at a low range of frequencies.

SUMMARY OF THE INVENTION

It has been revealed that especially at or around the distal tip or distal end of the above conductors which are positioned at a distal part or section of an instrument, the above RF heating of adjacent or surrounding tissue of an examination object is most pronounced in comparison to the RF heating of the tissue adjacent or surrounding other sections or regions along the related conductor, and that this RF heating is substantially caused by a maximum of the RF field strength at the distal tip (especially if this tip is electrically open) and the resulting comparatively high density of the electric flux lines of the electric RF field which are localized at the said tip in comparison to other positions along the conductor.

Further, it has been revealed that such an RF tip-heating is most pronounced when an RF resonance (i.e. a resonant RF common mode current) is excited on the related conductor by the RF excitation field of the MR imaging apparatus.

It has also been revealed that for many applications this RF tip-heating is much more important for the RF-safety of an interventional or a non-interventional instrument than a heating of the conductor along its length (and correspondingly of the adjacent or surrounding tissue along the length of the conductor) which is caused by its ohmic resistance and the resulting ohmic heating by the resonant RF common mode currents.

Further, the above and other known solutions for providing RF-safety are often not suitable for use in connection with very thin instruments likes those which are to be introduced into an examination object. For example, trap circuits or RF chokes which are used for suppressing resonant RF currents on a conductor can only be used safely and efficiently outside an examination object due to their dimensions and due to a potential heating at the traps themselves. Apart from this, the efficiency of such traps is strongly dependent on their position along the conductor and on the position of the conductor outside, adjacent or partly or totally inserted into an examination object because the effective RF common mode wavelength on the conductor or cable is dependent on the dielectric characteristics of the adjacent or surrounding tissue. All this poses the general problem that such (distal) conductors which are to be introduced into an examination object (e.g. of those interventional instruments which are provided for MR guided vascular interventions) can become resonant themselves, so that the examination object is subject to an RF heating.

Especially in cases, in which rather long conductors remain free of any trap circuit (which are especially those sections of conductors which are to be introduced into an examination object), there is a pronounced danger that resonances can be excited on those conductors also due to conductor loops which accidentally occur when the related instrument is handled or operated by a user. It has been revealed, that trap circuits which are applied at a proximal end of the instrument can even aggravate this RF-safety problem.

Finally, all these problems are not limited to interventional instruments, but occur generally in case of any elongated electrically conductive elements, objects or structures as explained above, and non-interventional instruments like RF surface coils and the connected RF transmission lines or cables at a proximal part or section of the instrument that may interact with the electromagnetic RF excitation fields inherent to the MR imaging technique.

An object underlying the invention is to find a solution for these problems and to provide an interventional or non-interventional instrument which is made of or comprises an elongate or longitudinal electrically conductive element ("conductor") with RF-safety or an improved RF-safety, so that an RF heating of adjacent or surrounding tissue of an examination object due to the above RF common mode currents which are induced by an RF/MR excitation field generated by an MR imaging apparatus is reliably prevented or at least decreased to such an extent that it no longer detrimentally influences or threatens the related examination object.

This object is solved according to claim 1 by an RF-safe interventional or non-interventional instrument for use during MR imaging or MR examination in an MR imaging apparatus, wherein the instrument is made of or comprises a conductor which is subject to an RF common mode current which is induced in the conductor when the instrument or conductor is exposed to an RF/MR excitation field generated during MR imaging or MR examination, wherein RF-safety is achieved or increased by effectively adding at least one electrically damping element to the conductor at least approximately at a position along the conductor where an RF electric field strength of the RF common mode occurs, in particular at which an increased or a maximum of the RF electric field strength or an increased or a maximum of the RF common mode current occurs, both in comparison to other positions along the conductor, wherein the damping element is at least one of a resistive, a reactive and a dielectric load which attenuates or suppresses the RF common mode current or the RF electric field strength on the conductor at this position. RF common mode currents are suppressed by the damping element placed at any position where, if no steps are taken, the RF electric field of the RF common mode occurs. Very strong supression is achieved by placing the damping element at or near a maximum of the RF electric field strength of the RF common mode.

The number of the damping elements and the selection thereof (i.e. a resistive, a reactive and/or a dielectric load), as well as the dimensioning of such one or more loads, is conducted such that a desired RF-safety, or, in other words, a desired degree of suppressing or decreasing of any heating of the related tissue by the induced RF common mode currents is obtained. This degree can be increased e.g. by increasing the number of damping elements along the conductor, i.e. by effectively adding more than one damping element at the above (one) position, or by effectively adding at more than one of the above positions each one or more damping elements. Alternatively or additionally to both these cases the said degree can be increased by increasing the electrically damping properties of the one or more damping elements as generally known and/or as explained below.

The degree of suppressing or decreasing of the RF induced heating is selected e.g. on the kind of the instrument, and e.g. if this instrument is an interventional or a non-interventional instrument, because an interventional instrument is usually in a much closer contact to an examination object than a non-interventional instrument and accordingly needs a higher degree of suppressing any RF induced heating.

Generally, the invention is based on the recognition that the said conductor can represent an oscillator which is excited for RF resonances by the RF/MR excitation field of the related MR imaging apparatus, and that the resulting RF heating of the said tissue can be prevented, suppressed or limited by increasing the energy loss of the oscillator, or, in other words, by spoiling its Q-factor, in a known manner and especially by effectively adding at least one electrically damping element, especially a load or a lossy element, preferably in the form of at least one of a resistive, a reactive and a dielectric load, to the oscillator.

The term "effectively adding" either means an electrical connection in the sense of a galvanic connection of such a damping element, especially if it is realized in the form of a resistive and/or a reactive load, or an inductive or capacitive coupling by positioning such a damping element at or around the related conductor without a galvanic connection. Here, a capacitive coupling may be used especially if the damping element is realized e.g. in the form of a dielectric load, and an inductive coupling may be used if e.g. the damping element comprises a wire.

This solution can advantageously be realized especially in case of a conductor which has a proximal end which is electrically open for RF common mode currents, so that at this proximal end (which is a known defined position) a maximum of the RF field strength of the RF common mode current occurs and the damping element can effectively be added to the conductor at the position of this maximum. Such a conductor which has an open proximal end is typically not provided for feeding electrical signals but is e.g. a guide wire or a wire-braided introducer sheath of an interventional instrument.

A general advantage of the solution according to the invention is, that it is applicable to any conductor which is subject to RF-safety problems, either as a stand-alone solution if sufficient RF-safety is obtained by this, or in combination with any other known solution, in order to increase the RF-safety, because the solution according to the invention neither compromises the function nor the efficiency of any other concept applied to obtain or increase RF-safety.

Another advantage is, that the invention is easy to implement because it does not require any modifications of the related conductor itself (which is to be made RF-safe). The dependent claims disclose advantageous embodiments of an RF-safe interventional or non-interventional instrument according to the invention.

More in details, in order to increase the efficiency of a resistive load, the conductor is preferably elongated electrically to provoke noticeable RF currents at the position of the resistive load. Electrical elongation can be realized by the load itself, especially in the form of an elongated resistive wire which is connected with one end with the conductor, wherein the other end is electrically open, and/or one or more additional inductive elements that electrically lengthen the conductor.

In order to increase the efficiency of a dielectric load, it is positioned along the conductor preferably at a position of a maximum of the electric RF-field generated on the conductor.

At least one maximum of the RF field strength is provided at one (or more) certain desired position(s) along the conductor by means of at least one RF trap circuit which is effectively added to the conductor, wherein the damping element is added preferably at this position. The term "effectively added" in this connection means the same as explained above with respect to the damping element.

These embodiments can advantageously be realized especially in case of a conductor which has no proximal end which is electrically open, as e.g. those conductors which are provided for feeding electrical signals via further RF transmission lines etc. to/from the above RF transmit units, MR receive units, power supply units or other especially remote signal receiving and/or signal processing units.

Such an RF trap circuit or RF choke is to be understood as an element that provides a high impedance to RF common mode currents on the conductor so that it provokes a maximum of the RF field strength at its position along the conductor and/or can dissipate the current at this position into the damping element. Depending on the type of the instrument and its wiring, an RF trap circuit or RF choke can be realized e.g. in the form of a resistor, a capacitor, a resonant LC circuit, a transformer or simply by the proximal end of a needle or wire (for example in case of a wire braid or guide wire) of the related instrument.

An advantage of such an RF trap circuit is that it keeps the above proximal units like RF transmit units, MR receive units, power supply units or other especially remote signal receiving and/or signal processing units decoupled from the spoiled resonator at the distal conductor.

A basic RF-safety monitoring is allowed.

It will be appreciated that the features of the invention can be combined with each other and with further independent safety mechanisms without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

Figure 1:
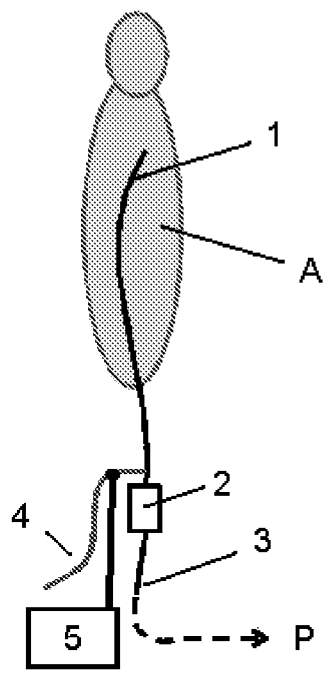
FIG. 1 shows a schematic set-up of an interventional instrument according to a first exemplary embodiment of the invention.

FIG. 1 shows a basic set-up of an interventional instrument according to a first embodiment of the invention. Further, FIG. 1 schematically shows an examination object A in the form of a patient.

The interventional instrument substantially comprises a first conductive element 1 at a distal part or section of the instrument (in the following "distal conductor") which is at least partly to be introduced into the examination object A. The distal conductor 1 comprises a distal end which is electrically open for RF common mode currents, and a proximal end which is connected preferably via an RF trap circuit like an RF choke 2 to a distal end of a second conductive element 3 at a proximal part or section of the instrument (in the following "proximal conductor") which connects the interventional instrument with related operating units, control units or power supply units P (not indicated) at its proximal end and is realized e.g. in the form of an RF transmission line or cable.

Further, FIG. 1 shows an electrically damping element in the form of a resistive and/or a reactive load, preferably in the form of a wire extension 4, which is effectively added via a galvanic connection with one of its ends with the distal conductor 1. The other end of the wire extension 4 is left free (i.e. electrically open for RF common mode currents).

Generally, such a damping element is effectively added at least approximately at a position along a (distal or proximal) conductor 1; 3 at which an increased or a maximum of the RF electric field strength or an increased or a maximum of the RF common mode current occurs, both in comparison to other positions along the related conductor 1; 3. Likewise, more than one damping element can effectively be added to the conductor 1; 3 at each one of a plurality of the above first mentioned positions. Further, the at least one damping element is selected such that it attenuates or suppresses the RF common mode currents or the RF electric field strength on the conductor 1; 3 at the related position(s) to such an extent that the resulting and remaining RF heating of the adjacent or surrounding tissue of an examination object by the conductor is prevented or at least limited to an acceptable degree and by this the RF-safety is achieved or improved. All this applies to all embodiments of the invention.

While a maximum of the RF field strength is generated at the distal (open) end of the distal conductor 1, the positions of further maxima of the RF electric field strength along the distal conductor 1 (or of the instrument as a whole) are generally undefined and depend on the structure and external cable connections of the instrument, and other reasons as explained above. Due to the fact, that it is of course not suitable to connect a resistive load 4 to this distal end or tip (because it is to be introduced into an examination object), it is preferred to provoke such a maximum, e.g. by means of an RF trap circuit or RF choke 2 as explained above, which is effectively added to the distal conductor 1 preferably at a location, at which also a resistive load 4 could be easily connected with the distal conductor 1, e.g. in the region of or at the proximal end of the distal conductor 1, namely at a proximal position along the distal conductor 1 which always remains outside the examination object A. (In case of e.g. a guide wire, the proximal end is also electrically open for RF common mode currents, so that such an RF trap circuit 2 is not necessary for provoking a maximum of the RF field strength at the proximal end).

The resistive load 4 is indicated in FIG. 1 in the form of a simple wire extension. The length of the wire extension or the dimensioning of any other embodiment of the load 4, for example in the form of any resistive and/or reactive load, is selected such that it spoils the Q-factor of the oscillator (which is represented by the distal conductor 1 and is now completed by the resistive load 4 as explained above) such that the energy loss and by this the suppression of the RF common mode currents or of the RF field strength at this position is high enough in order to prevent or limit the resulting RF heating at the distal tip of the distal conductor 1 and especially of the adjacent or surrounding tissue of the examination object to a desired degree as explained above.

The wire extension 4 can contain lumped or distributed resistors (especially in the form of e.g. highly resistant wire segments). Further, in order to increase the damping effect, reactive elements especially in the form of inductors can be connected into the wire extension 4, by which the wire extension 4 is made virtually longer, so that more RF current will flow from the conductor 1 through the wire extension 4.

By such a load 4, an additional lossy path for the RF common mode current on the distal conductor 1 is provided which in turn leads to an absorption of RF energy which lowers the amount of energy dissipated at the distal end of the distal conductor 1.

As mentioned above, an RF trap circuit 2 is realized in a known manner, and preferably in the form of an RF choke or in the form of any element which provides a high impedance to RF common mode currents on the conductor. In case of an RF choke based on a resonant LC circuit, a local RF field maximum is only provoked for fields of the resonance frequency of the LC circuit. Consequently, such an RF choke is preferably tuned to the Larmor frequency, which coincides with the frequency of the RF resonant currents on the conductor which are responsible for the above RF-heating.

It shall be noted, that more than one resistive and/or reactive load 4 can be connected with the distal conductor 1 at the same or different positions of the distal conductor 1 along its length as explained above. Accordingly, more than one RF trap circuit 2 can be used, wherein a load 4 can also be connected with the distal conductor 1 at a position at which an at least increased RF electric field strength can be expected without providing an RF trap circuit 2 at this position. However, for reasons of efficiency, it is preferred to provide an RF trap circuit 2 at one or more suitable positions along the distal conductor 1, especially in the region of its proximal end, and to connect a resistive and/or reactive load 4 with the conductor 1 at the position of such an RF trap circuit 2, preferably at the distal side of the RF trap circuit 2 as indicated in FIG. 1.

Finally, FIG. 1 shows an optional temperature sensor 5 which is connected with the load 4. Since the RF heating at or around the distal tip of the distal conductor 1 is related to the RF common mode current flowing in the distal conductor 1 between its distal tip and its proximal end (i.e. the RF trap circuit 2) and in the load 4, the RF heating of the load 4 is related to and indicates or provides a measure for the RF heating at the distal tip of the distal conductor 1 (the proximal conductor 3 is effectively decoupled from the distal conductor 1 by means of the RF trap circuit 2). Thus, the temperature sensor 5 which is effectively connected with the load 4 for sensing the temperature of the load 4, allows a basic RF-safety monitoring.

All the above accordingly applies for the provision and positioning of at least one damping element and one or more possible RF trap circuits along the proximal conductor 3.

Figure 2:
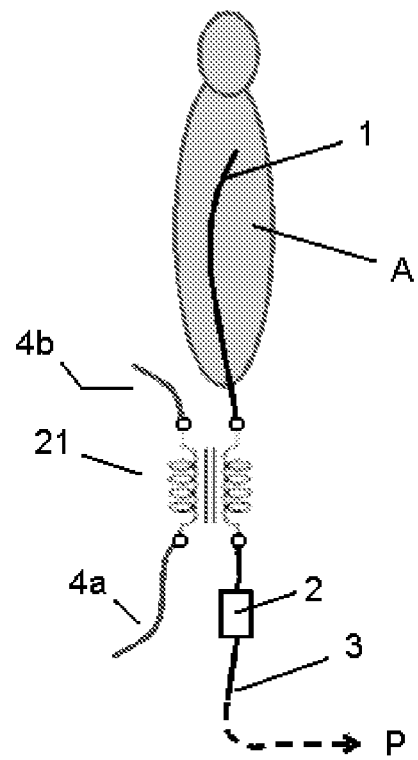
FIG. 2 shows a schematic set-up of an interventional instrument according to a second exemplary embodiment of the invention.

FIG. 2 shows a basic set-up of an interventional instrument according to a second embodiment of the invention together with an examination object A.

The same or corresponding components or elements as in FIG. 1 are denoted with the same or corresponding reference numbers.

The basic difference between this second embodiment and the first embodiment is, that the damping element is effectively added to the distal conductor 1 by an inductive coupling which is realized exemplarily by means of a transformer 21. The transformer 21 comprises a first winding which is serially connected into the distal conductor 1 and a second winding with which the damping element 4a, 4b is connected. The damping element is realized in the form of a first wire extension 4a and a second wire extension 4b, wherein the first wire extension 4a is connected with one end of the second winding and the second wire extension 4b is connected with the other end of the second winding of the transformer 21. The first and the second wire extension 4a, 4b can have equal or different lengths, and they can be realized in the same or in different ways, e.g. one of the wire extensions in the form of a resistive load only, and the other wire extension in the form of a resistive load or in the form of a resistive and a reactive load and vice versa. Again, the damping element 4a, 4b is selected as explained above in order to increase the energy loss of the oscillator represented by the distal conductor 1 and by this to prevent or limit the above explained RF heating. Regarding an optional RF trap circuit 2, reference is made to the above explanation. Further, an inductive coupling 21 as explained above can also be provided in the proximal conductor 3.

An optional temperature sensor is not indicated in FIG. 2 but can effectively be connected with one of the wire extension 4a, 4b in order to sense its temperature as explained above with respect to the first embodiment.

Figure 3:
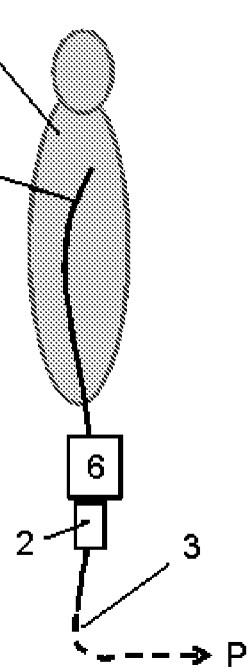
FIG. 3 shows a schematic set-up of an interventional instrument according to a third exemplary embodiment of the invention.

FIG. 3 shows a basic set-up of an interventional instrument according to a third embodiment of the invention together with an examination object A.

The same or corresponding components or elements as in FIGS. 1 and 2 are denoted with the same reference numbers.

The interventional instrument again comprises a distal conductor 1 which is to be introduced into the examination object A, and a proximal conductor 3 in the form of a RF transmission line or cable which connects the interventional instrument with related operating units, control units or power supply units P (not indicated). The basic difference between this third embodiment and first and the second embodiment is that according to the third embodiment an electrically damping element in the form of at least one lossy dielectric load 6 is provided instead of a resistive and/or a reactive load 4; 4a, 4b. It is again effectively added to the distal conductor 1 at a position of the distal conductor 1 of an increased or maximum of the RF resonant field strength. Preferably an RF trap circuit especially in the form of an RF choke 2 is again provided for provoking such a maximum or increase (if the distal conductor 1 has no electrically open proximal end as explained above), and accordingly, the lossy dielectric load 6 is positioned close to the RF choke 2 at the proximal end of the distal conductor 1. Apart from this difference, the explanations above with respect to the first embodiment also apply for the third embodiment of the invention. An optional temperature sensor is not indicated in FIG. 3 but can effectively be connected with the dielectric load 6 in order to sense its temperature as explained above with respect to FIG. 1.

The lossy dielectric load 6 may be of any substance of suitable specific resistance that otherwise meets the criteria of the respective instrument or medical device. In order to achieve a sufficient flow of the resonant RF current into the dielectric load 6 and thus the corresponding electrically damping effect, the lossy dielectric load 6 must be capacitively coupled to a sufficient degree to the distal conductor 1, and must be of adequate size.

Generally, the electrically damping element (i.e. the resistive and/or reactive or dielectric or any other suitable load 4; 6) and the possible RF trap circuit 2 (especially in the form of an RF choke) can be integrated for example into a hand-piece of an interventional on non-interventional instrument.

The above explanations apply accordingly also for the proximal conductor 3, so that it can be provided with at least one electrically damping element (i.e. the resistive and/or reactive or dielectric or any other suitable load 4; 4a, 4b; 6) and at least one optional RF trap circuit 2 as well.

In case of an instrument in the form of a wire-braided introducer sheath, the damping element 4; 4a, 4b (together with the transformer 21 if applicable); 6 and the optional RF trap circuit 2 can be integrated into a proximal end (i.e. the end which remains outside an examination object) of the sheath.

Especially in case of an electrically conductive guide-wire, the damping element 4; 6 and the optional RF trap circuit 2 is preferably attached to the proximal end of such a wire by means of a mechanical fastening means such that the damping element and the optional RF trap circuit can be temporarily taken off by a user in order to remove a related catheter over the proximal end of the wire.

In case of an instrument in the form of a wire-braided catheter or a deflectable catheter with an electrically conductive pull wire, an RF trap circuit 2 is usually not required because a maximum of the RF electric field strength is generated at the proximal open end of such a wire-braid or pull wire which usually extends inside a hand-piece of the catheter. The hand-piece is simply constructed to comprise the connection of the proximal end to the related resistive and/or reactive or other load, especially in the form of a wire extension as explained above.

An active tracking catheter can also be provided in the form of an RF-safe instrument according to the invention. As generally known, such a catheter usually comprises one or more tracking coils of any form that are connected to an MR receiver by means of any form of distal conductors inside the catheter and a proximal conductor in the form of a RF transmission line or cable. The purpose of the tracking coils is to receive MR signals in order to localize or image especially the tip of the catheter. The RF trap circuit(s) on those conductors and/or RF transmission lines or cables can be conventional RF chokes, an LC trap circuit or a transformer.

The efficacy in temperature reduction for an embodiment of a distal conductor or a proximal RF transmission line or cable according to the invention and incorporated into such an active tracking catheter for connecting a tracking coil with a related MR receiver shall be explained with reference to FIG. 4. This Figure shows the measured temperature increase dT at a tracking coil of an active catheter as a function of time t after switching on a common RF/MR excitation field which is switched off after about 150 seconds. The experimental set-up is represented by FIG. 1.

Figure 4:
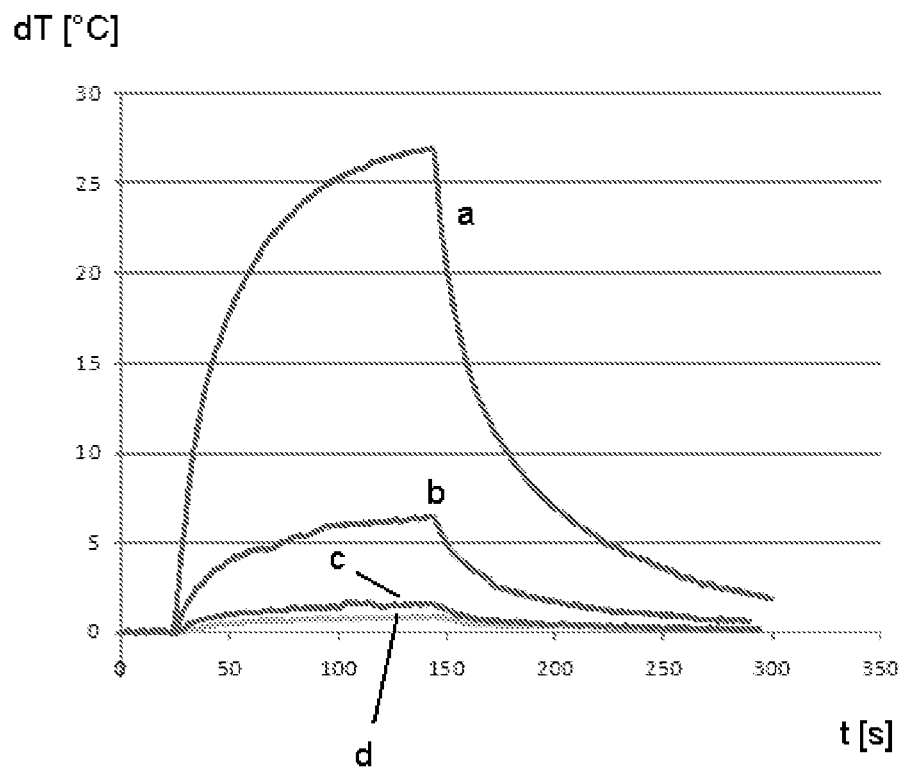
FIG. 4 shows a graph of various temperature reductions which were obtained experimentally by different embodiments of the invention.

Curve a of FIG. 4 shows the temperature development with an RF trap or choke 2 only which is placed at a distal end of the hand-piece of the tracking catheter without any load 4. The considerable temperature increase shows that strong resonant RF heating still occurs. When a load in the form of a wire extension 4 with a length of about 1 meter and a resistance of about 1 kOhm is connected with the conductor 1 at its proximal end and distally from the RF trap or choke 2 (the position of the latter is unchanged) as exemplarily shown in FIG. 1, the temperature development of curve b results. This curve shows that the RF heating is significantly reduced.

If the RF trap or choke 2 is shifted by about 30 cm to a more proximal position, the RF heating could be suppressed even more. Curve c shows the temperature development for such a position without any load 4. However, in practice, the RF trap positions can usually not be adjusted satisfactory for minimal heating in patients. Curve d shows a similar low temperature development in case of again connecting a wire extension 4 with a length of about 1 m and a resistance of about 1 kOhm with the conductor 1 at its proximal end and distally from the RF choke 2 as shown in FIG. 1. It is to be noted that the length and the resistance of the wire extension 4 for these measurements have been made randomly and were not optimized in order to obtain the best damping performance The feasibility of the inventive solution can also be demonstrated by a simulation according to FIGS. 5 and 6.

Figure 5:
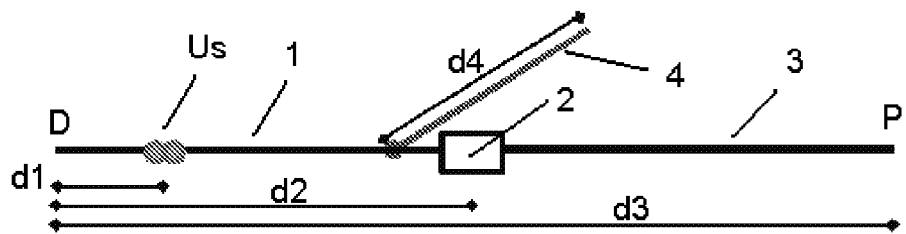
FIG. 5 shows a simplified model of an embodiment of the invention.
Figure 6:
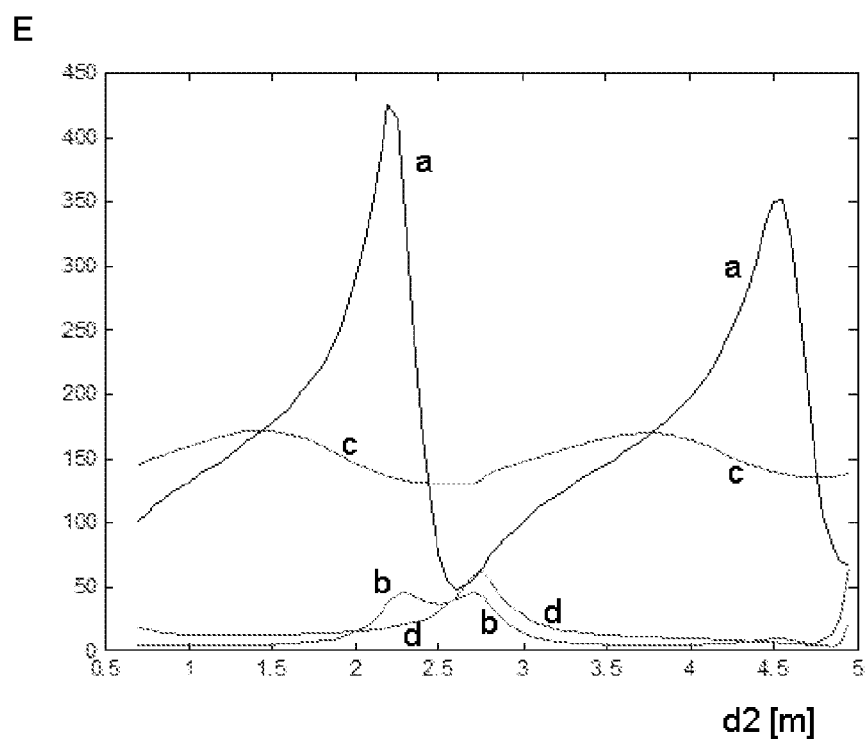
FIG. 6 shows a graph of various simulated E field strengths at the tip of an instrument in relation to a trap position in FIG. 4, which demonstrates that the embodiment vastly reduces a resonant enhancement of the E field strength at the instrument tip.

For evaluating the curves according to FIG. 6, a set-up according to FIG. 5 has been used. FIG. 5 schematically shows a distal conductor 1 and a proximal conductor 3, which extend between a distal tip D (usually the tip of a catheter etc.) and a proximal end P which is usually connected with related operating units as explained above for operating the catheter. Between the distal and the proximal conductor 1, 3 an RF trap circuit 2, preferably an RF choke is positioned and effectively added to the conductors. Further, a wire extension 4 is effectively added as explained above by connecting it with one of its ends to the proximal end of the distal conductor 1 at the distal side of the RF trap circuit 2. Again, the other end of the wire segment 4 is electrically open. Finally, it is assumed that an RF voltage source Us is positioned at a distance d1 of about 30 cm from the distal tip D of the distal conductor 1 which in this simulation represents the excitation by the RF/MR excitation field transmitted by an MRI apparatus in reality. Accordingly, the distal conductor 1 together with the wire extension 4 represents an oscillator as explained above. Further, the distance of the RF trap circuit 2 from the distal tip D is denoted with d2, the total length of the distal and the proximal conductor 1, 3 between the distal tip D and the proximal end P is denoted with d3, and the length of the wire extension 4 is denoted with d4.

The simulation shown in FIG. 5 has been evaluated for a resonance frequency of 64.2 MHz, a total length d3 of the conductors 1, 3 of 5 m and a length d4 of the wire extension 4 of 1 m having a resistance of 1 kOhm.

FIG. 5 shows various developments of the electric RF field E at the distal tip D and at the proximal end P in dependence on the distance d2 of the RF trap circuit 2 from the distal tip D.

In detail, curve a shows the development of the electric RF field E at the distal tip D in dependence on the distance d2 of the RF trap circuit 2 without any load or wire extension 4. This curve shows that at two certain distances d2 of the RF trap circuit 2, a considerable resonant behavior of the distal conductor 1 can be observed.

Curve b shows the development of the electric RF field E at the proximal end P again for different distances d2 of the RF trap circuit 2 from the distal tip D without any load or wire extension 4.

When connecting a load in the form of the wire extension 4 with the distal conductor 1 as shown in FIG. 5, the development of the electric RF field E at the distal tip D in dependence on the distance d2 of the RF trap circuit 2 (wherein the position of the load 4 always follows the position of the RF trap circuit 2) results according to curve c. It shows that the RF resonances disappear for any distances d2 of the RF trap circuit 2 from the distal tip D.

Finally, curve d shows the development of the electric RF field E at the proximal end P again for different distances d2 of the RF trap circuit 2 (together with the load 4) form the distal tip D together with the wire extension 4 as shown in FIG. 5.

In essence, the comparison of curves a and c shows that the wire extension 4 vastly reduces the electric field at the tip D that is associated with heating inside the patient. Curves b and d are given for completeness and show that the electric RF field E at point D is always low, which proves that the RF trap circuit 2 is working properly.

It shall be noted that other lengths d2 of the wire extension 4 have been proven to be effective. The length d2 can easily be optimized for a certain interventional or non-interventional instrument by experiments and measurements for achieving desired or optimal damping properties.

Generally and as shown above, the solution according to the invention can also be applied for a proximal conductor in the form of an RF transmission line or cable for connecting e.g. a hand-piece of a catheter with a related MR receiver or another signal processing unit for operating a tracking coil, ECG electrodes or temperature sensors on the catheter, e.g. in order to limit or prevent any RF heating at the tip of the respective cables in the catheter.

Further, the solution according to the invention can be applied for any non-interventional instruments like RF local or surface coils, head coils, pointers and other as mentioned above, in order to obtain or enhance RF-safety of a related RF transmission line or cable for connecting the non-interventional instrument with related operating units, especially for preventing that a conductor which is located close to a patient RF heats the patient.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An RF-safe interventional or non-interventional instrument for use in an MR imaging apparatus, the instrument comprising:
   a conductor which is subject to an RF common mode current,
   at least one electrically damping element disposed at approximately a position along the conductor where an RF electric field strength of the RF common mode occurs, wherein the damping element is a resistive load in the form of a wire extension which has one end electrically connected with the conductor, wherein the other end is electrically open, to attenuate or suppress the RF common mode current or the RF electric field strength on the conductor, and
   a temperature sensor configured to sense the temperature of the damping element.

2. An RF-safe interventional or non-interventional instrument for use in an MR imaging apparatus, the instrument comprising:
   a conductor which is subject to an RF common mode current,
   at least one electrical damping element disposed at approximately a position along the conductor where an RF electric field strength of the RF common mode occurs, wherein the damping element is selected to be at least one of a resistive, a reactive or a dielectric load which attenuates or suppresses the RF common mode current or the RF electric field strength on the conductor, and
   a temperature sensor configured to sense the temperature of the damping element.

3. The RF-safe interventional or non-interventional instrument according to claim 2, further comprising:

at least one RF trap circuit disposed at the position to provide a high impedance to the RF common mode currents.

4. The RF-safe interventional or non-interventional instrument according to claim 3, wherein the damping element is disposed at a position distally from the position and adjacent to the RF trap circuit.

5. The RF-safe interventional or non-interventional instrument according to claim 3, wherein the RF trap circuit includes one of an RF choke, a resistor, a capacitor, a resonant LC circuit, or a transformer.

6. The RF-safe interventional or non-interventional instrument according to claim 2, wherein the conductor feeds electrical signals between the instrument and proximal RF transmit units, MR receive units, power supply units or other remote signal receiving and/or signal processing units.

7. The RF-safe interventional or non-interventional instrument according to claim 2, wherein the conductor is an electrically conductive guide-wire or pacemaker lead or wire-braided introducer sheath or another longitudinal or elongated electrically conductive element.

8. The RF-safe interventional or non-interventional instrument according to claim 2 further including a catheter, a probe, a surgical device, a biopsy or puncture needle, a pointer, an implant, a wire-braided introducer sheath, a conductive guide-wire, a pacemaker lead, a position marker, a surface coil or a local coil or a head coil.

9. The RF-safe interventional or non-interventional instrument according to claim 2, wherein the position on the conductor is where an increased or a maximum of the RF electric field strength or an increased or a maximum of the RF common mode current occurs relative to other positions along the conductor.

* * * * *